United States Patent [19]

Sharp

[11] Patent Number: 5,082,696
[45] Date of Patent: Jan. 21, 1992

[54] METHOD OF FORMING SEMICONDUCTING AMORPHOUS SILICON FILMS FROM THE THERMAL DECOMPOSITION OF DIHALOSILANES

[75] Inventor: Kenneth G. Sharp, Midland, Mich.

[73] Assignee: Dow Corning Corporation, Midland, Mich.

[21] Appl. No.: 140,191

[22] Filed: Dec. 31, 1987

Related U.S. Application Data

[63] Continuation-in-part of Ser. No. 914,898, Oct. 3, 1986, abandoned.

[51] Int. Cl.$^5$ .................. C23C 16/00; C23C 16/46
[52] U.S. Cl. ........................ 427/255; 427/162; 427/167; 427/255.1; 427/255.2
[58] Field of Search .............. 427/248.1, 255.1, 255, 427/162, 167, 255.2; 428/446, 450

[56] References Cited

U.S. PATENT DOCUMENTS

| | | | |
|---|---|---|---|
| 2,148,328 | 5/1985 | Hirooka et al. | 427/248.1 |
| 2,788,280 | 4/1957 | Rust et al. | 427/248.1 |
| 3,809,571 | 5/1974 | Berlat | 427/248.1 |
| 4,064,521 | 12/1976 | Carlson | 427/255.1 |
| 4,196,438 | 4/1980 | Carlson | 427/39 |
| 4,217,148 | 8/1980 | Carlson | 427/39 |
| 4,217,374 | 8/1980 | Ovshinsky et al. | 427/248.1 |
| 4,466,992 | 8/1984 | Dreiling | 427/255.1 |
| 4,469,045 | 9/1984 | Chesworth | 427/255.5 |
| 4,485,121 | 11/1984 | Matsumura | 427/39 |
| 4,634,605 | 1/1987 | Wiesmann | 427/255.1 |

OTHER PUBLICATIONS

Auguelli and Murri, Mter. Chem. and Phys. (Switzerland) 9, 301–5 (1983).
Everysteyn, Chemical–Reaction Engineering in the Semi-Conductor Industry, Philips Res. Repts. 29, 45–46, 1974.
Scott et al., Kinetics and Mechanism of Amorphous Hydrogenated Silicon Growth by Homogeneous Chemical Vapor Deposition, Appl., Phys., Lett. 39 (1) Jul. 1981.

*Primary Examiner*—Shrive Beck
*Attorney, Agent, or Firm*—James E. Bittell; Roger E. Gobrogge

[57] ABSTRACT

The invention relates to the chemical vapor deposition of dihalogenated silanes to form stable, abrasion resistant, photoconductive, dopable semiconductor amorphous films on substrates. Additional hydrogen and plasma discharge conditions are not necessary to practice the invention.

17 Claims, No Drawings

METHOD OF FORMING SEMICONDUCTING AMORPHOUS SILICON FILMS FROM THE THERMAL DECOMPOSITION OF DIHALOSILANES

This application is a continuation-in-part of copending application Ser. No. 914,898 filed on Oct. 3, 1986, now abandoned.

BACKGROUND OF THE INVENTION

The present invention relates to the discovery that pyrolysis of certain dihalogenated monosilanes or mixtures of dihalogenated monosilanes can result in the formation of a highly stable, highly abrasion resistant, photoconductive, dopable semiconductor film on a substrate.

Amorphous polymeric materials of silicon and hydrogen (hereafter referred to as a-SiH) have emerged as a new class of semiconductors in recent years. Such materials are described, for example, in D. Carlson, U.S. Pat. No. 4,064,521, issued on Dec. 20, 1976. The materials are generated as thin films from the decomposition of silane ($SiH_4$) in electrical discharges or, less frequently, from the thermal decomposition of silane or higher hydrogen-containing silanes (e.g., $Si_2H_6$, $Si_3H_8$, etc.) as described in a PCT patent application by A. MacDiarmid and Z. Kiss published as International Publication No. WO 82/03069 dated Sept. 16, 1982.

When it is desirable to include additional elemental constituents in the amorphous films, co-reactants such as phosphine ($PH_3$) or diborane ($B_2H_6$) are added to the starting materials. When fluorine is to be incorporated into an amorphous film, tetrafluorosilane ($SiF_4$) is most commonly added to the reactant mixture. This is described for example in U.S. Pat. No. 4,217,374 granted to Ovshinsky and Izu on Aug. 12, 1980. Similarly, chlorine atoms can be incorporated into films via decomposition of mixtures of silicon tetrachloride ($SiCl_4$) and silane or hydrogen (see, for example, V. Augelli and R. Murri, Mater. Chem. and Phys. (Switzerland) 9, 301-5 (1983)).

A disadvantage to the use of silane, disilanes or polysilanes ($Si_nH_{2n+2}$) as a starting material for generation of a-SiH relates to the high explosion hazard of silane/air mixtures. An operational consequence of this explosion hazard is the frequent use of inert carrier gases as diluents in these systems. Both discharge (plasma) and chemical vapor deposition (CVD) routes to a-SiH from silane also have disadvantageous features. Conventional discharge systems require relatively sophisticated and expensive equipment to remove the reaction by-products. Silane-based CVD systems, while simple, suffer from a tendency to undergo vapor nucleation unless the pressure is very low. This behavior restricts the range of permissible operating conditions for such thermal decompositions.

United Kingdom Patent No. 2,148,328, issued to M. Hirooka, et al., on May 30, 1985, teaches the decomposition of various silanes, including halosilanes ($SiX_4$), cyclic polymeric halosilanes ($SiX_2)_n$, where n is greater than or equal to 3, di- and polysilanes such as $Si_nHX_{2n+1}$ and $Si_nH_2X_{2n}$. These materials are decomposed via electric discharge, photolysis, high temperature, or catalytically and mixed with a requisite second stream consisting of a vapor phase material selected from the group consisting of $H_2$, $SiH_4$, $SiH_3Br$, or $SiH_3I$ wherein the second stream has also been decomposed.

The obvious disadvantage of such prior art, one which clearly distinguishes it from the instant invention, is the necessity of having two materials to decompose. Hirooka, et al. requires the second stream as the source of hydrogen to facilitate the reduction of the halosilane to the amorphous silicon. The instant invention, however, has sufficient hydrogen in the single component dihalomonosilane to produce the desired amorphous silicon film. Several of the molecular precursors claimed by Hirooka, et al., such as $(SiH_2)_3$ or $(SiX_2)_3$, where X=F or Cl have either not been reported as being prepared elsewhere in the literature or have proved exceedingly difficult to synthesize. Hirooka, et al., does not teach the synthesis of these elusive molecules.

United Kingdom Patent number 2,156,385, issued Oct. 9, 1985 to Tanaka et al., teaches the deposition of a silicon film on a heated substrate from a reactant fluorosilane gas in the plasma state. However, Tanaka et al. does not teach the use of chemical vapor deposition of dihalosilanes to form amorphous silicon-containing films.

Thus the instant invention is distinguished from prior art utilizing chemical vapor deposition of disilanes, polysilanes, and reduction systems requiring dual streams of starting materials. The instant invention is also distinguished from the prior art utilizing plasma deposition systems.

SUMMARY OF THE INVENTION

The present invention relates to the formation of amorphous silicon films prepared from the thermal decomposition, often referred to as chemical vapor deposition (CVD), of dihalosilanes. By "dihalosilane" herein is meant a monosilane compound in which the silicon atom has bonded to it two halogen atoms and two hydrogen atoms. The term "amorphous" is herein construed to include both noncrystalline and microcrystalline materials, in which the crystallites are less than 50 Angstroms in dimension, and are not contiguous so as to form well defined grain boundaries. The films are formed from decomposition of vapor phase dihalomonosilanes, $X_2SiH_2$, at elevated temperatures. No additional source of hydrogen is needed in the instant invention nor is the use of electric discharges (plasma) necessary. The use of dihalosilane as source gas for the CVD method provides an important purification capability over that of disilane (or higher molecular weight) starting materials. Siloxane impurities in the disilane (and higher) source gases of the prior art can introduce unacceptably high amounts of oxygen into the film being deposited. Siloxane impurities are easily removed from dihalomonosilanes. It should also be noted that tetrahalomonosilanes such as tetrachloro- or tetrafluorosilane and the corresponding trihalosilanes cannot be employed as starting materials in the decomposition to provide satisfactory films according to the invention. The instant invention also simplifies the feed process of the material to be decomposed by reducing the number of reactants from two to one since an additional source of hydrogen is not required. The hydrogen initially on the dihalosilane results in silicon-hydrogen bonds in the film, said silicon-hydrogen bonds being known in the art to be associated with a lowering of the defect density in the amorphous silicon film.

The instant invention also relates to a method of forming amorphous polymeric silicon-containing films on a substrate which method comprises decomposing a dihalosilane or mixture of dihalosilanes in the vapor phase wherein the halogens of the dihalosilane or mixture of dihalosilanes are independently chosen from the group consisting of fluorine, chlorine, bromine, and iodine, at a temperature between 400 degrees and 600° C. in a reaction chamber containing a substrate which is thermally and chemically stable at the decomposition temperature in the atmosphere of the reaction chamber, whereby said films are formed on said substrate. A preferred temperature range for the thermal decomposition of the instant invention is between 450° and 570° C.

The instant invention features the further advantage that the dihalomonosilanes utilized are not susceptible to vapor nucleation at higher pressures. When amorphous silicon-containing films are generated from silane, care must be taken to limit the system pressure so as to avoid formation of particulates in the vapor phase, with consequent degradation of the deposited material.

A further aspect of the invention relates to the formation of electronic, electro-optical, and photovoltaic devices including, for example, solar cells, thin film transistors, or optical data storage media, as well as corrosion resistant coatings, abrasion resistant coatings and devices and articles derived therefrom. A variety of possible devices based on amorphous silicon-containing films derived from the instant invention will be apparent to those skilled in the art.

DETAILED DESCRIPTION

The instant invention produces semiconducting, dopable, air-stable silicon-containing amorphous films from the thermal decomposition of dihalosilanes. The films produced by the instant invention exhibit strong adhesion to substrates, are abrasion resistant, are stable at elevated temperatures, and are strong absorbers of visible light.

Dihalosilanes, such as difluorosilane, $H_2SiF_2$, and/or dichlorosilane, $H_2SiCl_2$, are placed in an evacuated chamber, for example a glass or metal container, along with a substrate to be coated with an amorphous silicon film. Any container material able to withstand the temperature and reduced pressure conditions of the CVD process can be used to form the deposition chamber.

The choice of substrates is limited only by the need for thermal and chemical stability at the decomposition temperature in the atmosphere of the decomposition vessel. Thus the substrate to be coated can be, for example, but is not limited to, various types of glass, metals, such as steel and aluminum, plastics able to withstand the reaction temperatures, and ceramic materials, such as aluminum oxide, silicon nitride, and silicon oxynitride.

In the simplest implementation, a glass ampoule serves as the deposition chamber. Both the deposition chamber and substrate are first cleaned (e.g., in an alkaline detergent) and rinsed with a highly purified solvent, preferably water or "electronic grade" methanol. The deposition chamber is then attached to a vacuum line, the contents evacuated, and the vessel thoroughly heated under vacuum with, for example, a gas-oxygen torch. The dihalosilane is transferred to the deposition chamber in such a manner as to preclude exposure to the atmosphere. The deposition chamber is sealed with a natural gas-oxygen torch and heated in an oven or furnace for a time generally in the range of 10 to 90 minutes at a temperature in the range of from 400° C. to 600° C. and preferably in the range of from 450° C. to 570° C. During this time the starting material decomposes and forms a silicon film on the substrate. Then the reaction by-products, trihalosilane and hydrogen (and any unreacted starting material if present), may conveniently be removed by evacuation after the deposition chamber has been reattached to the vacuum line. The substrate, onto which the decomposed dihalosilane starting material has deposited an amorphous silicon film, is then removed. By this method, difluorosilane and dichlorosilane have been thermally decomposed in the vapor phase to deposit amorphous silicon films on various substrates. The resulting coatings are reflective, air-stable, abrasion resistant, moisture resistant, photoconductive, semiconductive amorphous silicon-containing films.

Alternate modes of film production are available in an all metal high vacuum deposition chamber. The deposition chamber is constructed from stainless steel and features a turbomolecular pump so as to provide oil-free operation, precise pressure and flow control, and multiple reactant inlet channels. Dihalomonosilanes may be decomposed under either static (no-flow) or dynamic (flow) conditions. In either mode, the deposition chamber is evacuated to less than $10^{-6}$ Torr and power to the substrate heater supplied so as to bring the temperature of the surface of the desired substrate into the range 400°-600° C. The surface of the substrate may be heated prior to introduction of the source gas into the deposition chamber such as in a dynamic (flow) process or the source gas may be first introduced into the chamber and then the substrate heated as is more typical of a static process. The present invention is intended to encompass either sequence of heating the substrate.

For static depositions, the region of the deposition chamber proximal to the substrate is charged with the source gas and any desired dopant to a total pressure of from 20 to 500 Torr, isolated from the pump, and the deposition reaction allowed to proceed for 10 to 90 minutes.

Films can be deposited from flowing reactant streams in the same deposition chamber. In this case, the system is evacuated and the substrate heated as described above, and then a flow rate of the desired dihalomonosilane or mixture of dihalomonosilanes and any desired dopants of from 5 to 100 standard cubic centimeters per minute (sccm) is established. The system pressure is in the range of 20 to 500 Torr. The deposition reaction is allowed to proceed for 10 to 90 minutes. Any unreacted starting materials or byproduct gases are swept from the deposition region with a nitrogen purge into a chemical scrubber unit.

When forming silicon-containing films by the method of the present invention, it is important to provide a sufficient pressure of the source gas in the decomposition chamber so that the rate of deposition will reach useful levels. Especially, when temperature sensitive substrates are coated, it is important to obtain deposition of the film quickly to minimize any damage that more prolonged exposure to the elevated temperatures might cause to the substrate. Generally, source gas pressures of 20 to 500 Torr in the deposition chamber are required to obtain a useful rate of deposition. It is preferred to use source gas pressures of 50 to 500 Torr to obtain faster rates of deposition when thermally sensitive substrates are coated.

The unique higher-pressure deposition method of the present invention is based on the discovery that, even at substantially higher pressures, dihalosilanes are much less prone to undergo vapor nucleation when compared to previously used CVD source gases such as silane and disilane. Vapor nucleation is an undesirable effect resulting in the formation of particulates in the vapor phase and substantial reduction in the quality of deposited films. The occurrence of vapor nucleation at source gas pressures of about 1 to 5 Torr and above has restricted previous CVD methods to operating conditions where source gas pressures are often maintained as low as 0.1 Torr.

Films produced by the instant invention are useful as semiconducting materials in photovoltaics, passive optical layers, corrosion resistant coatings, hermetic barrier coatings, and abrasion resistant coatings, among other applications obvious to those skilled in the art. Because both the tetrahalosilanes ($X_4Si$) and trihalosilanes ($X_3SiH$), where X is selected from the class consisting of fluorine, chlorine, bromine, and iodine, are not effective thermal sources of amorphous silicon films for these applications without an additional source of hydrogen the present invention using the dihalomonosilanes is unique and unobvious. Monohalosilanes, such as $SiH_3F$ and $SiH_3Cl$, are difficult to synthesize and are highly susceptible to decomposition through redistribution reactions [(see H. Emeleus and A. Maddock, J. Chem. Soc. 1944, 293)]

EXAMPLES

EXAMPLE 1

Variable Temperature Deposition

Difluorosilane (20 Torr) was placed in a cleaned Pyrex ® ampoule along with a Corning 7059 glass substrate. The ampoule was sealed and heated for 60 minutes at a temperature of 400° C. At this point, formation of a thin film was apparent in the ampoule. The ampoule was then heated to successively higher temperatures; 30 minutes each at 450° C. and 475° C., and 15 minutes each at 500° C. and 550° C. The ampoule was then cooled to room temperature and attached to a vacuum line to remove the reaction by-products. The ampoule was broken and the film-coated substrate removed. No evidence of powder formation was apparent. Film thickness was determined by a surface profilometer to be approximately 1000 Angstroms. The film was golden-brown in color, with a high reflectivity. The dark conductivity of the film was determined to be $1.1 \times 10^{-9}$ Siemens/cm, and the conductivity under AM1 irradiation was $1.1 \times 10^{-7}$ Siemens/cm. A measurement of the temperature dependence of dark conductivity led to an evaluation of the activation energy of 0.785 eV.

EXAMPLE 2

Constant Temperature Deposition

A film sample was prepared in the manner of Example 1 except that the initial system pressure was 100 Torr and the deposition temperature remained constant at 550° C. Analysis of the residual gases in the system after deposition revealed the presence of hydrogen and trifluorosilane along with unreacted difluorosilane. No evidence of vapor nucleation or powder formation existed.

EXAMPLE 3

Metal Deposition Chamber

250 Torr of difluorosilane was placed in the all metal high vacuum deposition chamber in the vicinity of a Corning 7059 glass substrate heated to 500° C. Deposition was allowed to occur for 90 minutes to give a smooth, shiny, air-stable film whose thickness was estimated to be 800 Angstroms.

EXAMPLE 4

Deposition from Flowing Reactant Stream

Difluorosilane was flowed through a metal deposition chamber at a rate of 5 sccm and at a pressure of 100 Torr. Deposition onto a Corning 7059 glass substrate, maintained at 550° C. was allowed to occur for 120 minutes to give a smooth, air-stable, highly colored film.

EXAMPLE 5

Mechanical Properties

Difluorosilane was coated onto a piece of Corning 7059 glass in the manner of Example 2. Potential of the film for abrasion resisting coating applications was established from the following tests; Military specification test C-675A for optical films was applied to the coating. Commonly referred to as the "eraser test", this is a rigorous test of abrasion resistance for such films. The test produced no perceptible change in the film. Military specification test M-13508 for adhesion was performed on the material. The test produced no change in the film, which is evidence of excellent adhesion to the glass substrate.

A Teledyne-Tabor Shear/Scratch Tester was used to test abrasion resistance. The diamond stylus in the tester was placed under a 10 gram load and dragged across the surface of the film. Virtually no damage to the film was evident on microscopic examination of the surface.

EXAMPLE 6

N-Doped Material

Difluorosilane was coated onto a piece of Corning 7059 glass in the manner of Example 2, except that 1 mol % phosphine ($PH_3$) was added as a gaseous dopant. The resultant film displayed a dark conductivity of $1 \times 10^{-1}$ Siemens/cm and an activation energy of 0.14 eV. These data indicate an increase of eight orders of magnitude in conductivity in the doped material relative to its undoped (intrinsic) counterpart.

EXAMPLE 7

P-Doped Material

Difluorosilane was coated onto a piece of Corning 7059 glass in the manner of Example 2, except that 1 mol % diborane ($B_2H_6$) was added as a gaseous dopant, and the system pressure and temperature were 50 Torr and 450° C., respectively. The resultant film displayed a dark conductivity of $3.7 \times 10^{-5}$ Siemens/cm.

EXAMPLE 8

Deposition from Dichlorosilane

Dichlorosilane was utilized as a film precursor in the manner of Example 2 to produce an amorphous silicon-containing film at 560° C. in a 20 minute reaction. The film had a shiny golden appearance and displayed excellent adhesion to the glass substrate.

EXAMPLE 9

Optical Properties

A film generated in the manner of Example 2 was examined for its optical absorption spectrum in the visible and near infrared wavelengths. A Tauc plot was used to determine an "optical" band gap of 1.55 eV. The absorption coefficient at 500 nm is $3 \times 10^5$ cm$^{-1}$.

EXAMPLE 10

Limits of Film Formation

Difluorosilane at a system pressure of 1.0 Torr was flowed at a rate of 3 sccm over a Corning 7059 glass substrate heated to 525° C. No film was observed on the substrate after a reaction period of 60 minutes.

EXAMPLE 11

Photoresponse Limitation

A 1350 Angstroms thick film sample generated in the manner of Example 4, was evaluated for electrical properties. Dark conductivity was measured to be $3 \times 10^{-7}$ S/cm, and the photoconductivity was $3.15 \times 10^{-7}$ S/cm.

EXAMPLE 12

Adhesion Test Following Salt Bath Immersion

Difluorosilane was coated onto a piece of Corning 7059 glass in the manner of Example 2. The coated glass was immersed in 0.1M NaCl solution for three days at room temperature. The coated glass was then removed, patted dry, and the film was cross hatched with a razor blade. Cellophane Scotch brand tape was applied over the scored portion, pressed, and then removed. The film did not demonstrate adhesive failure.

EXAMPLE 13

Deposition on Ceramic Substrate

Difluorosilane (50 Torr) was placed in a quartz demountable deposition chamber along with two ceramic substrates, i.e., sapphire (Al$_2$O$_3$) and a thin plate of BeO. The deposition chamber was then heated for 60 minutes at a temperature of 525° C. and then cooled to room temperature and attached to a vacuum line to remove the reaction by-products. The deposition chamber was opened and the film-coated substrates removed.

That which is claimed is:

1. A method of forming an amorphous polymeric silicon-containing film on a substrate which method comprises placing a substrate in a deposition chamber;
   evacuating air from the deposition chamber;
   introducing a source gas at a pressure of 20 to 500 Torr into the deposition chamber, the source gas consisting essentially of dihalosilane or a mixture of dihalosilanes wherein each halogen of the dihalosilane or mixture of dihalosilanes is independently chosen from the group consisting of fluorine, chlorine, bromine, and iodine;
   heating the substrate in the deposition chamber to a temperature of 400° to 600° C. to form, without glow or plasma discharge, an amorphous polymeric silicon-containing film on the substrate; and
   removing the substrate from the deposition chamber.

2. The method of claim 1 wherein the source gas is difluorosilane.

3. The method of claim 1 wherein the source gas is dichlorosilane.

4. The method of claim 1 wherein the source gas is dibromosilane.

5. The method of claim 1 wherein the source gas is diiodosilane.

6. The method of claim 1 wherein a continuous flow of source gas is passed through the deposition chamber over the heated substrate.

7. The method of claim 1 wherein the deposition chamber is closed after introducing the source gas.

8. The method of claim 1 wherein the pressure of the source gas in the deposition chamber is 50 to 500 Torr.

9. The method of claim 8 wherein the substrate in the deposition chamber is heated to a temperature of 450° to 570° C.

10. The method of claim 9 wherein the substrate is selected from the group consisting of glass, metal, ceramic material, and plastic.

11. The method of claim 1 wherein the method further comprises the addition of a dopant to the deposition chamber whereby the film formed of the substrate is doped by the dopant.

12. The method of claim 1 wherein the substrate is an electronic device.

13. The method of claim 1 wherein the substrate is a photovoltaic device.

14. The method of claim 1 wherein the substrate is a solar cell device.

15. The method of claim 1 wherein the substrate is an electro optical device.

16. The method of claim 1 wherein the substrate is a thin film transistor device.

17. The method of claim 1 wherein the substrate is an optical data storage medium.

* * * * *